US011991896B2

United States Patent
Uhm et al.

(10) Patent No.: US 11,991,896 B2
(45) Date of Patent: *May 21, 2024

(54) DISPLAY PANEL HAVING SECOND SUBSTRATE WITH BARRIER STRUCTURE FOR DEFINING OPEN SPACES THAT ADJOIN ADHESIVE LAYER

(71) Applicant: LG Display Co., Ltd., Seoul (KR)

(72) Inventors: SeongYong Uhm, Paju-si (KR); SeungHan Lee, Paju-si (KR); Tae-Kyung Kim, Paju-si (KR); KyuNam Kim, Paju-si (KR); Dohyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/189,005

(22) Filed: Mar. 23, 2023

(65) Prior Publication Data

US 2023/0232652 A1    Jul. 20, 2023

Related U.S. Application Data

(63) Continuation of application No. 17/239,312, filed on Apr. 23, 2021, now Pat. No. 11,641,757.

(30) Foreign Application Priority Data

Dec. 23, 2020    (KR) .................. 10-2020-0182365

(51) Int. Cl.
*H10K 50/842*    (2023.01)
*H10K 50/84*    (2023.01)
*H10K 59/12*    (2023.01)

(52) U.S. Cl.
CPC ....... *H10K 50/8428* (2023.02); *H10K 50/846* (2023.02); *H10K 59/12* (2023.02)

(58) Field of Classification Search
CPC ... H10K 50/8428; H10K 50/846; H10K 59/12
See application file for complete search history.

(56) References Cited

U.S. PATENT DOCUMENTS 8,692,239 B2    4/2014 Son et al.
2010/0244668 A1*    9/2010 Nakamura ............. H10K 59/88
313/504

(Continued)

FOREIGN PATENT DOCUMENTS

KR    10-2013-0037561 A    4/2013
KR    10-2020-0139569 A    12/2020

OTHER PUBLICATIONS

United States Office Action, U.S. Appl. No. 17/239,312, dated Sep. 28, 2022, 15 pages.

*Primary Examiner* — Michael Jung
(74) *Attorney, Agent, or Firm* — Fenwick & West LLP (57) ABSTRACT

A display panel comprises a first substrate including a display area and a non-display area surrounding the display area, a light emitting diode disposed in the display area on the first substrate, an adhesive layer covering the display area and the non-display area on the first substrate, and a second substrate bonded to the first substrate by the adhesive layer, wherein the second substrate includes a barrier structure portion for defining a plurality of open spaces on one surface of the second substrate that adjoins the adhesive layer.

18 Claims, 6 Drawing Sheets

(56) References Cited

U.S. PATENT DOCUMENTS

2013/0087769 A1    4/2013  Son et al.
2017/0117504 A1    4/2017  Kim et al.
2019/0372056 A1* 12/2019  Lee ..................... H10K 50/844
2020/0251688 A1    8/2020  Chung et al.
2020/0388783 A1  12/2020  Kang et al.
2021/0066408 A1*  3/2021  Wu ....................... H10K 71/00

* cited by examiner

DISPLAY PANEL HAVING SECOND SUBSTRATE WITH BARRIER STRUCTURE FOR DEFINING OPEN SPACES THAT ADJOIN ADHESIVE LAYER

CROSS-REFERENCE TO RELATED APPLICATION

This application is a continuation application of U.S. patent application Ser. No. 17/239,312 filed on Apr. 23, 2021, which claims priority to Republic of Korea Patent Application No. 10-2020-0182365 filed on Dec. 23, 2020, all of which are incorporated by reference herein.

BACKGROUND

Technical Field

The present disclosure relates to a display panel.

Description of the Related Art

With the advancement of the information age, the demand for display devices for displaying an image has increased with various forms.

Among such display devices, an organic light emitting display device is a self-luminance display device, and may inject holes and electrons from an anode electrode for hole injection and a cathode electrode for electron injection into a light emitting layer and emit light to display an image when an exciton generated by combination of the injected holes and electrons is transited from an excited state to a ground state.

The organic light emitting display device is degraded by internal factors such as degradation of an electrode and a light emitting layer due to oxygen and degradation caused by reaction between surfaces of the light emitting layer and at the same time is easily degraded by external factors such as external moisture, oxygen, UV rays and manufacturing conditions of an element. Particularly, since external oxygen and moisture critically affect lifespan of an element, encapsulation of the organic light emitting display device is very important.

The disclosure of the above-described background art is owned by the inventor of the present disclosure to devise this specification or is technical information acquired by a process of devising this specification, but cannot be regarded as the known art disclosed to the general public before this specification is disclosed.

BRIEF SUMMARY

The present disclosure has been made in view of the above problems, and it is an object of the present disclosure to provide a display panel that may prevent side permeation of external moisture or oxygen from occurring.

In addition to the object of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display panel comprising a first substrate including a display area and a non-display area surrounding the display area, a light emitting diode disposed in the display area on the first substrate, an adhesive layer covering the display area and the non-display area on the first substrate, and a second substrate bonded to the first substrate by the adhesive layer, wherein the second substrate includes a barrier structure portion for defining a plurality of open spaces on one surface that adjoins the adhesive layer.

In the display panel according to the present disclosure, as a plurality of barriers are provided on an encapsulation substrate bonded to an array substrate by an adhesive layer including a plurality of hygroscopic particles, an interval of a side where the encapsulation substrate and the array substrate are bonded to each other may be minimized, whereby side permeation of external moisture or oxygen may effectively be blocked to improve moisture permeation resistance. Also, as moisture or oxygen may be blocked effectively to improve moisture permeation resistance, an encapsulation area of a non-display area may be reduced, whereby a narrow bezel may be embodied.

In addition to the effects of the present disclosure as mentioned above, additional objects and features of the present disclosure will be clearly understood by those skilled in the art from the following description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a display panel according to various embodiments of the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 1:
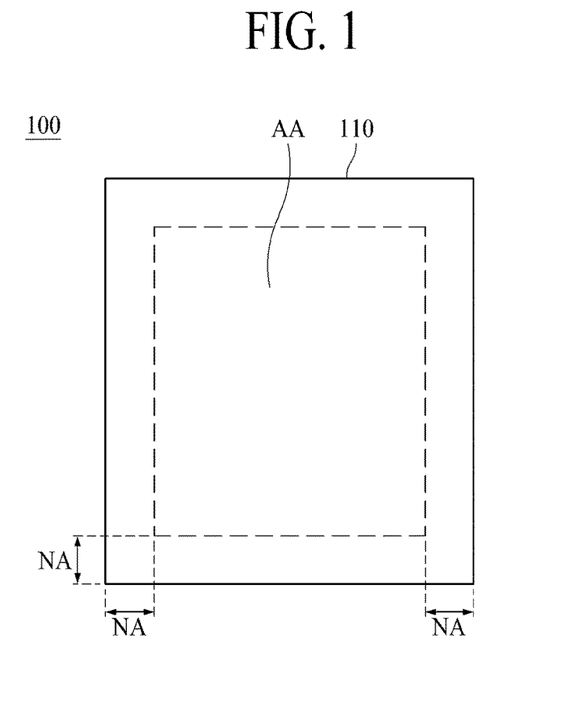
FIG. 1 is a plane view illustrating a display panel according to various embodiments of the present disclosure.

FIG. 1 is a plane view illustrating a display panel according to various embodiments of the present disclosure.

Referring to FIG. 1, the display panel 100 according to various embodiments of the present disclosure may include at least one display area (active area) AA and one or more non-display areas (non-active areas) NA.

An array of pixels may be disposed in the display area AA. One pixel may include a plurality of subpixels. In this case, the subpixel may be a minimum unit for expressing one color. Each subpixel may be associated with a subpixel circuit, and one subpixel circuit may be comprised of two transistors and one capacitor (2T1C) but is not limited thereto. One subpixel circuit may be embodied as a subpixel circuit to which 4T1C, 7T1C, 6T2C, or the like is applied. Also, the subpixel may be embodied in a top emission method, a bottom emission method or a dual emission method.

One or more non-display areas NA may be disposed near the display area AA. That is, the non-display area NA may adjoin one or more sides of the display area AA. In FIG. 1, the non-display area NA may surround the display area AA of a rectangular shape. However, a shape of the display area AA and shape/arrangement of the non-display area NA adjacent to the display area AA are not limited to the example shown in FIG. 1. The display area AA and the non-display area NA may be suitable for a design of an electronic device (or display device) provided with the display panel 100. An exemplary shape of the display area may be a rectangular shape, a pentagonal shape, a hexagonal shape, a circular shape, an oval shape, or the like.

Each pixel in the display area AA may be associated with a pixel circuit. The pixel circuit may include one or more switching transistors and one or more driving transistors. Each pixel circuit may electrically be connected with signal lines (gate lines, data lines, and the like) to perform communication with one or more driving circuits such as a gate driver and a data driver disposed in the non-display area NA.

The gate driver and the data driver may be embodied as thin film transistors (TFTs) in the non-display area NA. These drivers may be referred to as gate in panels (GIPs). Some components such as a data driver IC may be built in a separated printed circuit board, and may be coupled with a connection interface (pad, bump, pin, etc.) disposed in the non-display area NA by a circuit film such as a flexible printed circuit board (FPCB), a chip on film (COF), and a tape carrier package (TCP). The printed circuit board (COF, PCB, etc.) may be disposed behind the display panel 100.

The display panel 100 may include various additional elements for generating various signals or driving pixels in the display area AA. The additional elements for driving the pixels may include an inverter circuit, a multiplexer, an electro static discharge circuit, etc. The display panel 100 may also include additional elements associated with functions in addition to driving of the pixels. For example, the display panel 100 may include additional elements for providing a touch sensing function, a user authentication function (e.g., fingerprint recognition), a multi-level pressure sensing function, a tactile feedback function, etc. These additional elements may be disposed in the non-display area NA and/or an external circuit connected with the connection interface.

Figure 2:
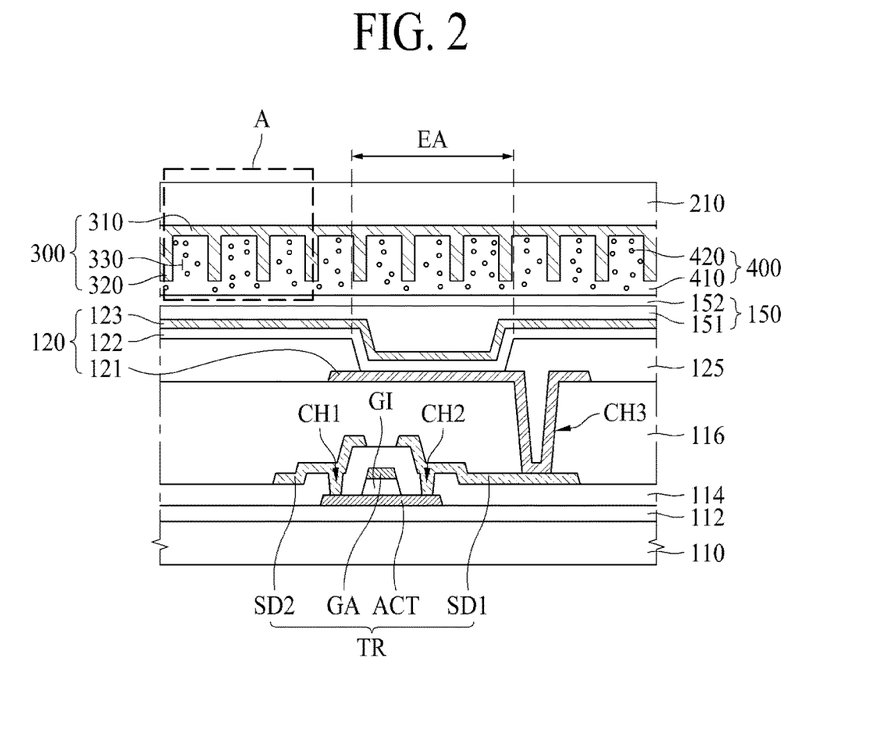
FIG. 2 is a cross-sectional view illustrating a display panel according to various embodiments of the present disclosure.

FIG. 2 is a cross-sectional view illustrating a display panel according to various embodiments of the present disclosure. FIG. 2 illustrates a portion of the display area AA of the display panel.

Referring to FIG. 2, the display panel according to various embodiments of the present disclosure may include a first substrate 100, and a second substrate 210 bonded to the first substrate 110. The display panel may include a thin film transistor TR, a light emitting diode 120 and an encapsulation layer 150 on the first substrate 110. The display panel may include a barrier structure portion 300 on the second substrate 210. The first substrate 110 and the second substrate 210 may be bonded to each other by an adhesive layer 400.

The first substrate 110 serves to support and protect various elements of the display panel 100. The first substrate 110 may be made of an insulating material, and may be a glass or plastic substrate. If the first substrate 110 is a plastic substrate, a polyimide based material or polycarbonate based material may be used as the first substrate 110, whereby the first substrate 110 may have flexibility. Since polyimide may be applied to a process of high temperature and is a material capable of being coated, it is mainly used as a plastic substrate. If the display panel 100 is based on a bottom emission method, the first substrate 110 may be formed of a transparent insulating material.

The thin film transistor TR may be disposed between the first substrate 110 and the second substrate 210. The thin film transistor TR may be disposed on the display area AA of the first substrate 110. According to various embodiments of the present disclosure, the thin film transistor TR may include a switching transistor, a driving transistor, etc.

A buffer layer 112 for protecting the thin film transistors TR from moisture permeated through the first substrate 110 may be disposed on the first substrate 110. The buffer layer 112 may include an insulating material. The buffer layer 112 may be made of silicon oxide (SiOx), silicon nitride (SiNx) or a multi-layered layer of SiNx and SiOx. For example, the buffer layer 112 may include a multi buffer and/or an active buffer. The multi buffer may be comprised of SiNx and SiOx, which are alternately stacked, and may delay diffusion of moisture and/or oxygen permeated into the first substrate 110. The active buffer may serve to protect an active layer ACT of the thin film transistor and shield various kinds of defects from the first substrate 110. The active buffer may be formed of amorphous silicon (a-Si).

The thin film transistor TR may include an active layer ACT, a gate insulating film GI, a gate electrode GA, a first source/drain electrode SD1, and a second source/drain electrode SD2. Although FIG. 2 illustrates that the gate electrode GA of the thin film transistor TR is formed in a top gate method in which the gate electrode GA is disposed above the active layer ACT, the gate electrode GA is not limited to the example of FIG. 2. The gate electrode GA of the thin film transistor TR may be formed in a bottom gate method in which the gate electrode GA is disposed below the active layer ACT or a double gate method in which the gate electrode GA is disposed above and below the active layer ACT.

The active layer ACT may be disposed on the buffer layer 112 on the first substrate 110. The active layer ACT may be made of amorphous silicon or polycrystalline silicon. The polycrystalline silicon has mobility more excellent than that of the amorphous silicon, and therefore has low energy power consumption and excellent reliability. Recently, an oxide semiconductor has been spotlighted owing to excellent mobility and uniformity. The active layer ACT may include a source region and a drain region, which include p type or n type impurities, and a channel between the source region and the drain region, and may include a lightly doped region between the source region and the drain region, which are adjacent to the channel. Also, a shielding layer for shielding external light entering the active layer ACT may be disposed on the first substrate 110.

A gate insulating film GI may be disposed on the active layer ACT. The gate insulating film GI is an insulating film made of an inorganic film, for example, a single layer of SiOx or SiNx or a multi-layered layer of SiOx and SiNx, and is provided to allow a current flowing in the active layer ACT not to flow to the gate electrode GA. The gate insulating film GI may be disposed to correspond to some region of the active layer ACT. For example, the active layer ACT may include a source region, a drain region and a channel region, and the gate insulating film GI may be disposed to vertically overlap the channel region of the active layer ACT.

The gate electrode GA may be disposed on the gate insulating film GI. The gate electrode GA serves as a switch for turning on or turning off the thin film transistor TR on the basis of an electric signal transferred from the outside through a gate line, and may be made of a single layer or a multi-layered layer of Cu, Al, Mo, Cr, Au, Ti, Ni and Nd, which are conductive metals, or their alloy.

An inter-layer dielectric film 114 may be disposed on the gate electrode GA. The inter-layer dielectric film 114 may be made of an inorganic film, for example, a single layer of SiOx or SiNx or a multi-layered layer of SiOx and SiNx.

The first source/drain electrode SD1 and the second source/drain electrode SD2 may be disposed on the inter-layer dielectric film 114. Each of the first and second source/drain electrodes SD1 and SD2 may be connected to the active layer ACT through contact holes CH1 and CH2 passing through the inter-layer dielectric film 114. Each of the first and second source/drain electrodes SD1 and SD2 may be made of a single layer or a multi-layered layer of Cu, Al, Mo, Cr, Au, Ti, Ni and Nd, which conductive metals, or their alloy.

A passivation layer made of an inorganic insulating film such as SiOx and SiNx may be disposed on the thin film transistor TR. The passivation layer may prevent unnecessary electric connection between elements of the thin film transistor TR and prevent the elements of the thin film transistor TR from being externally contaminated or damaged. The passivation layer may be omitted in accordance with a structure and characteristics of the thin film transistor and the light emitting diode.

Although FIG. 2 illustrates a driving thin film transistor of various thin film transistors for convenience of description, a switching thin film transistor, a capacitor, etc. may be included in the display area AA. If a gate signal is applied from a gate line to the switching thin film transistor, the switching thin film transistor transfers a data signal from a data line to a gate electrode of the driving thin film transistor. The driving thin film transistor transfers a current transferred through a power line to an anode in accordance with the data signal transferred from the switching thin film transistor, and light emission is controlled by the current transferred to the anode.

A planarization layer 116 may be disposed on the thin film transistor TR. The planarization layer 116 may protect the thin film transistor TR, reduce a step difference generated by the thin film transistor TR and reduce parasitic capacitance generated among the thin film transistor TR, the gate line, the data line and the light emitting diode 120. The planarization layer 116 may be formed of one or more organic materials of acrylic resin, epoxy resin, phenolic resin, polyamides resin, polyimides resin, unsaturated polyesters resin, polyphenylene resin, benzocyclobutene and polyphenylene-sulfides resin.

The light emitting diode 120 may be disposed on the planarization layer 116. The light emitting diode 120 may include a first electrode 121 (or anode electrode), a light emitting portion 122 (or organic layer) and a second electrode 123 (or cathode electrode). The light emitting diode 120 may be provided in a single light emission structure for emitting one kind of light, or may be provided in a structure in which a plurality of light emitting portions are stacked to emit white light. If the light emitting diode emits white light, a color filter may further be provided.

The first electrode 121 (or anode electrode) may be disposed on the planarization layer 116. The first electrode 121 is an electrode serving to supply holes to the light emitting portion 122, and may electrically be connected to the first source/drain electrode SD1 of the thin film transistor TR through a contact hole CH3 passing through the planarization layer 116. The first electrode 121 may be comprised of indium tin oxide (ITO), indium zinc oxide (IZO), etc., which are transparent conductive materials. If the display panel 100 is based on a top emission method in which light is emitted to a top portion, the first electrode 121 may further include a reflective layer to allow the emitted light to be more actively emitted toward the top portion where the second electrode 123 is disposed. The first electrode 121 may have a double layered structure in which a transparent conductive layer made of a transparent conductive material and a reflective layer are stacked in due order, or may have a three-layered structure in which a transparent conductive layer, a reflective layer and a transparent conductive layer are stacked in due order, wherein the reflective layer may be Ag or alloy containing Ag.

A bank 125 may be disposed on the first electrode 121 and the planarization layer 116. The bank 125 may define a light emission area EA actually emitting light. The bank 125 may be formed to cover an edge of the first electrode 121, thereby defining the light emission area EA. The bank 125 may be formed of an organic film such as acryl resin, epoxy resin, phenolic resin, polyamide resin, and polyimide resin.

The light emitting portion 122 (or organic layer) may be disposed on the first electrode 121 and the bank 125. The light emitting portion 122 may include at least one of a hole injection layer HIL, a hole transport layer HTL, an emission layer EML, an electron transport layer ETL and an electron injection layer EIL, and its elements may partially be omitted in accordance with a structure or characteristics of the display panel 100.

The second electrode 123 (or cathode electrode) may be disposed on the light emitting portion 122. The second electrode 123 serves to supply electrons to the light emitting portion 122. Since the second electrode 123 should supply electrons, the second electrode 123 may be made of a metal material such as Mg and Ag:Mg, which has a low work function. If the display panel 100 is based on a top emission method, the second electrode 123 may be a transparent conductive oxide based on ITO, IZO, indium tin zinc oxide (ITZO), zinc oxide (ZnO) and tin oxide (TiO).

The encapsulation layer 150 for preventing the light emitting diode 120 from being oxidized or damaged by external moisture, oxygen or impurities may be disposed on the light emitting diode 120. The encapsulation layer 150 may be formed to surround the light emitting diode 120. The encapsulation layer 150 may be formed in a double layered structure in which an organic material layer 151 and an inorganic material layer 152 are stacked alternately. The organic material layer 151 may be a capping layer disposed on the second electrode 123 to protect the first electrode 121, the light emitting portion 122 and the second electrode 123. The organic material layer 151 may be formed to be relatively thicker than the inorganic material layer 152 so as to sufficiently cover particles that may occur during a manufacturing process. The inorganic material layer 152 may serve to shield moisture or oxygen from being permeated into the light emitting diode 120. For example, the organic material layer 151 may include any one material of acryl resin, epoxy resin, phenolic resin, polyamide resin, polyimide resin, benzocyclobutene resin, and fluoride resin. The inorganic material layer 152 may include a material such as SiNx, SiOx, SiON or AlxOy.

The adhesive layer 400 may be disposed on the encapsulation layer 150. The adhesive layer 400 is formed to cover the display area AA and the non-display area NA of the first substrate 110 and serves to shield moisture or oxygen from being permeated into the light emitting diode 120. Also, the adhesive layer 400 serves to adhere the first substrate 110 provided with the light emitting diode 120 and the second substrate 210 to each other.

The adhesive layer 400 may seal the light emitting diode 120 and adhere the first substrate 110 and the second substrate 210 to each other. The adhesive layer 400 may include a hardening resin 410 and hygroscopic particles 420 dispersed in the hardening resin 410.

The adhesive layer 400 may be adhered to one surface (surface headed toward the first substrate 110) of the second substrate 210. The adhesive layer 400 may include a hardening resin 410 and hygroscopic particles 420. The hardening resin 410 may include an adhesive material such as epoxy, acryl, silicon or urethane. Also, the hardening resin 410 may be made of a transparent hardening resin. The hygroscopic particles 420 may be dispersed in the hardening resin 410 to adsorb or remove external moisture or oxygen through a physical or chemical reaction. The hygroscopic particles 420 may be transparent getter components, or may include hydrolytic components that may be hydrolyzed by reaction with external moisture.

The second substrate 210 is adhered onto the first substrate 110, which is provided with the light emitting diode 120, by the adhesive layer 400. The second substrate 210 may be disposed to face the first substrate 110, and one surface (surface headed toward the first substrate 110) of the second substrate 210 may adjoin the adhesive layer 400. The second substrate 210 may be formed of a material such as glass, plastic or metal, and the material of the second substrate 210 may be determined in accordance with a light emission direction of the display panel 100.

The second substrate 210 according to various embodiments of the present disclosure may include a barrier structure portion 300 on one surface (surface headed toward the first substrate 110) that adjoins the adhesive layer 400.

The barrier structure portion 300 may include a bottom portion 310 disposed on the second substrate 210, and a plurality of barrier portions 320 protruding from the bottom portion 310 to define a plurality of open spaces 330. The bottom portion 310 may have a plane shape over the one surface. The plurality of barrier portions 320 may protrude from the bottom portion 310 to define the plurality of open spaces 330. The bottom portion 310 may serve to insulate the second substrate 210. The bottom portion 310 is intended to prevent arching from occurring during a process of forming a coating film 315 surrounding the barrier structure portion 300 if the second substrate 210 is made of a metal material, but is not limited thereto. The bottom portion 310 may be omitted if the second substrate 210 is made of a non-metal material.

Hereinafter, the barrier structure portion 300 according to various embodiments of the present disclosure will be described in detail with reference to FIGS. 3 to 7.

Figure 3:
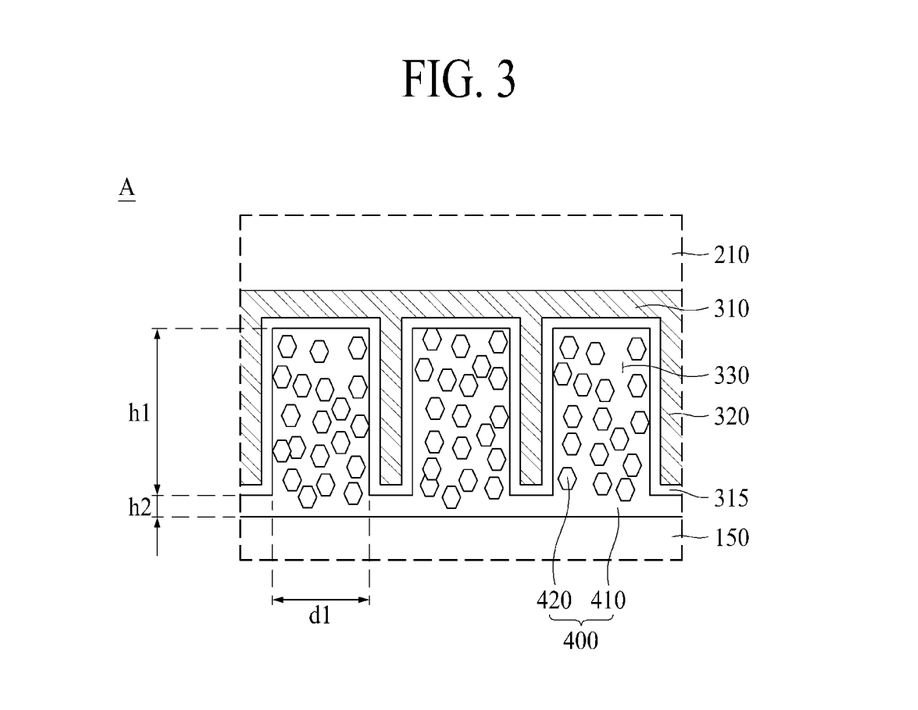
FIG. 3 is an enlarged view illustrating a portion A of FIG. 2.
Figure 4:
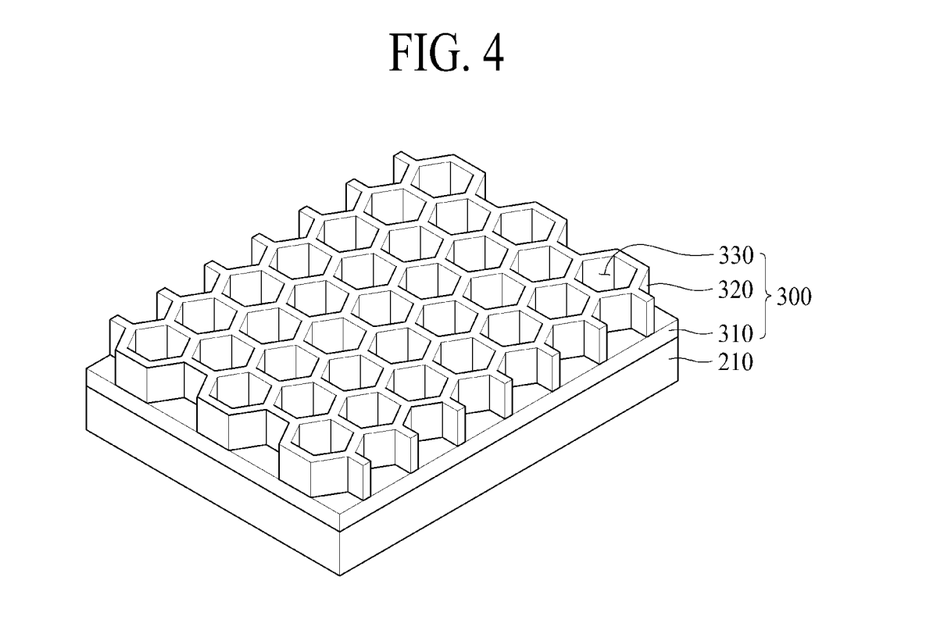
FIG. 4 is a perspective view illustrating a barrier structure portion according to various embodiments of the present disclosure.
Figure 5:
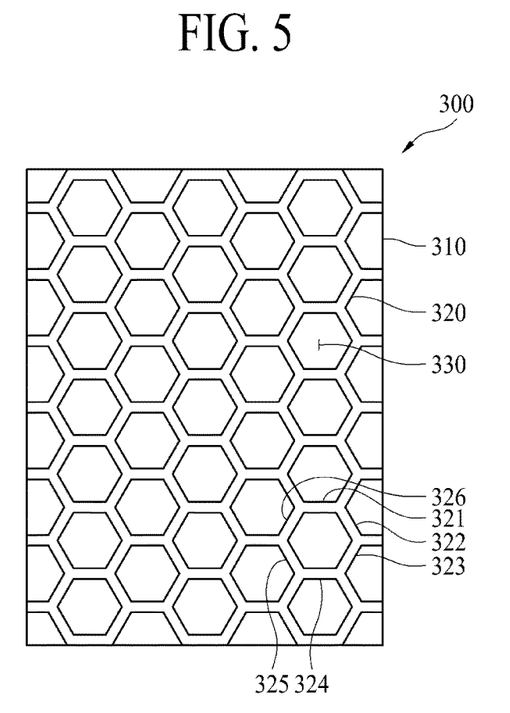
FIG. 5 is a plane view illustrating a barrier structure portion according to one embodiment of the present disclosure.
Figure 6:
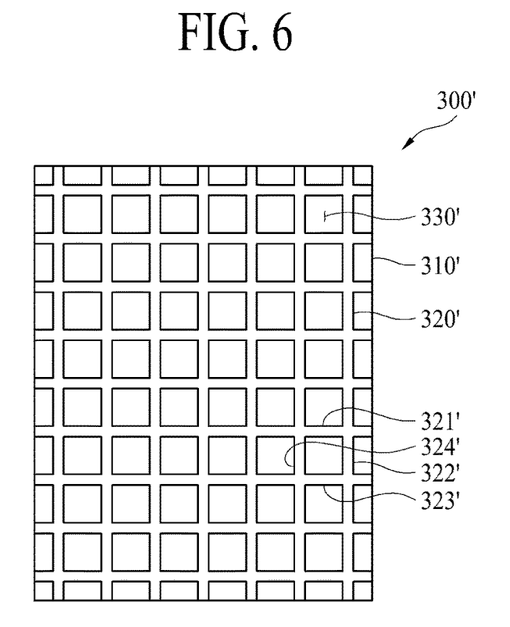
FIG. 6 is a plane view illustrating a barrier structure portion according to another embodiment of the present disclosure.
Figure 7:
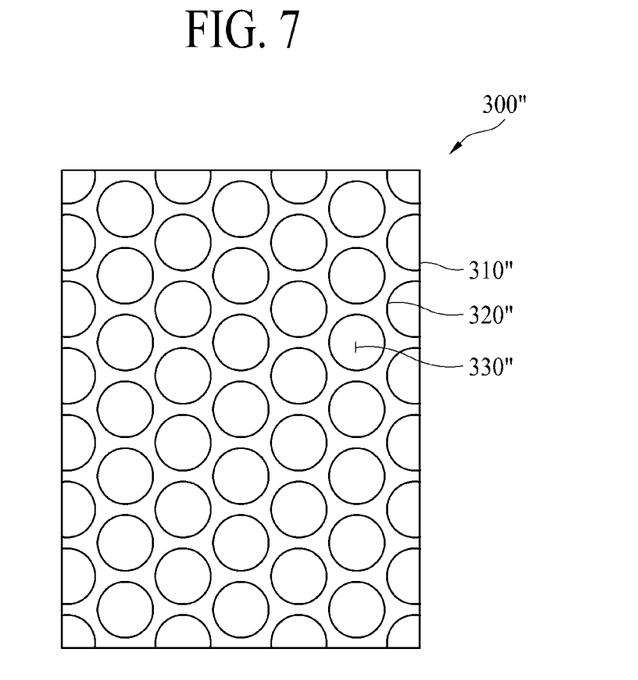
FIG. 7 is a plane view illustrating a barrier structure portion according to still another embodiment of the present disclosure.

FIG. 3 is an enlarged view illustrating a portion A of FIG. 2. FIG. 4 is a perspective view illustrating a barrier structure portion according to various embodiments of the present disclosure. FIG. 5 is a plane view illustrating a barrier structure portion according to one embodiment of the present disclosure. FIG. 6 is a plane view illustrating a barrier structure portion according to another embodiment of the present disclosure. FIG. 7 is a plane view illustrating a barrier structure portion according to other embodiment of the present disclosure.

Referring to FIG. 3, the barrier structure portion 300 according to various embodiments of the present disclosure may include a bottom portion 310 disposed on one surface (surface headed toward the first substrate 110) of the second substrate 210, a plurality of barrier portions 320 protruding from the bottom portion 310, and a plurality of open spaces 330 defined by the plurality of barrier portions 320. The bottom portion 310 and the plurality of the barrier portions 320 of the barrier structure portion 300 may be made of the same material. The bottom portion 310 and the plurality of the barrier portions 320 of the barrier structure portion 300 may be made of a polymer material. For example, in order to form the barrier structure portion 300, after a photopolymer is applied on the second substrate 210, the bottom portion 310 and the plurality of barrier portions 320 may be patterned using UV light and a mask. In this case, the UV light may be irradiated to the applied photopolymer by controlling intensity and/or time. Accordingly, the applied photopolymer is molded, and the bottom portion 310 of a certain thickness remains such that the second substrate 210 is not exposed, and the plurality of barrier portions 320 defining the plurality of open spaces 330 by being spaced apart from one another may be patterned. Alternatively, the barrier structure portion 300 may be formed using an imprinting process. In this case, after the photopolymer is applied on the second substrate 210, the applied photopolymer may be compressed by using a hard stamp of a shape opposite to the structure of the plurality of barrier portions 320 and the plurality of open spaces 330. Accordingly, the applied photopolymer is molded, and the bottom portion 310 of a certain thickness remains such that the second substrate 210 is not exposed, and the plurality of barrier portions 320 defining the plurality of open spaces 330 by being spaced apart from one another may be patterned.

As shown in FIG. 3, the barrier structure portion 300 may include a coating film 315 surrounding a surface. The coating film 315 may be made of a material different from that of the bottom portion 310 and the plurality of barrier portions 320 of the barrier structure portion 300, and may be formed to surround the bottom portion 310 and the plurality of barrier portions 320. The coating film 315 may be made of metal or inorganic oxide, and may allow the bottom portion 310 and the plurality of barrier portions 320 to shield moisture and oxygen from being permeated thereinto.

The adhesive layer 400 may be applied on the barrier structure portion 300 on one surface of the second substrate 210. The adhesive layer 400 may be applied to be higher than a height h1 of the barrier structure portion 300. As shown in FIG. 3, the adhesive layer 400 may be higher than a height h1 of the barrier structure portion 300 by as much as a height h2. For example, the height of the adhesive layer 400 may be higher than the height h1 of the barrier structure portion 300 by as much as 5 μm to 10 μm. The adhesive layer 400 may include a hardening resin 410 and hygroscopic particles 420. The second substrate 210 may be bonded to the first substrate 110 by the adhesive layer 400. The adhesive layer 400 may fill the plurality of open spaces 330 defined by the plurality of barrier portions 320 of the barrier structure portion 300. Also, the hygroscopic particles 420 in the adhesive layer 400 may be disposed in the plurality of open spaces 330.

An interval h2 between the second substrate 210 and the first substrate 110, which are adhered to each other by the adhesive layer 400, may be narrowed by the plurality of barrier portions 320 of the barrier structure portion 300. For example, the interval h2 between the encapsulation layer 150, which is the uppermost layer of the first substrate 110, and the plurality of barrier portions 320 of the barrier structure portion 300 may be 5 μm to 10 μm by interposing the adhesive layer 400 therebetween. That is, according to various embodiments of the present disclosure, as the barrier structure portion 300 is formed on the second substrate 210, the interval between the first substrate 110 and the second substrate 210 may be narrowed, and the hardening resin 410 and the hygroscopic particles 420 of the adhesive layer 400 may be filled in the plurality of open spaces 330 defined by the plurality of barrier portions 320. Particularly, as the hygroscopic particles 420 may be disposed in the plurality of open spaces 330, external moisture and oxygen may effectively be prevented from being permeated into the open spaces 330, whereby moisture permeation resistance may be improved.

The height h1 of the plurality of barrier portions 320 of the barrier structure portion 300, that is, the height h1 from the bottom portion 310 to the plurality of barrier portions 320 may be formed such that the interval h2 with the encapsulation layer 150 disposed at the uppermost end of the first substrate 110 by interposing the adhesive layer 400 may be 5 μm to 10 μm. For example, the height h1 of the plurality of barrier portions 320 may be 10 μm to 50 μm. In this case, if the height h1 of the plurality of barrier portions 320 is 50 μm or more, it is difficult for the hardening resin 410 of the adhesive layer 400 to be filled in the plurality of open spaces 330, whereby bubbles may be generated and persistent adhesion may be deteriorated. Also, when the coating film 315 of the barrier structure portion 300 is formed, void and uniformity may be deteriorated, whereby reliability may be deteriorated. Further, if the height h1 of the plurality of barrier portions 320 is 10 μm or less, initial adhesion may be lowered, and the light emitting diode 120 on the first substrate 110 may be damaged by the plurality of hygroscopic particles 420 dispersed in the hardening resin 410 of the adhesive layer 400.

A minimum diameter d1 of each of the plurality of open spaces 330 defined by the plurality of barrier portions 320 of the barrier structure portion 300, that is, the distance d1 between the respective barrier portions 320 in the bottom portion 310 may be 10 μm to 500 μm, preferably 50 μm to 200 μm. In this case, if the minimum diameter d1 of the plurality of open spaces 330 is 10 μm or less, the plurality of barrier portions 320 may be damaged by the hygroscopic particles 420 dispersed in the hardening resin 410 of the adhesive layer 400, or it may be difficult for the plurality of barrier portions 320 to be disposed in the plurality of open spaces 330. Also, if the minimum diameter d1 of the plurality of open spaces 330 is 500 μm or more, the adhesive layer 400 may flow down and then leak out to the outside.

Referring to FIGS. 4 and 5, in the barrier structure portion 300 according to various embodiments of the present disclosure, the bottom portion 310 may be disposed on the second substrate 210, and the plurality of open spaces 330 defined by the plurality of barrier portions 320 protruded from the bottom portion 310 may have a polygonal pattern on the plane. Each of the plurality of open spaces 330 may be defined by six barriers 321 to 326 to have a hexagonal pattern on the plane, and may spatially have a space of a hexagonal prism. However, the shape of the barrier structure portion 300 according to various embodiments of the present disclosure is not limited to the above example, and may be formed in various shapes as shown in FIGS. 6 and 7.

As shown in FIG. 6, in a barrier structure portion 300' according to another embodiment of the present disclosure, a bottom portion 310' may be disposed on the second substrate 210, and a plurality of open spaces 330' defined by a plurality of barrier portions 320' protruding from the bottom portion 310' may have a square pattern on the plane. Each of the plurality of open spaces 330' may be defined by four barriers 321' to 324' to have a square pattern on the plane, and may spatially have a space of a square prism.

As shown in FIG. 7, in a barrier structure portion 300'' according to still another embodiment of the present disclosure, a bottom portion 310'' may be disposed on the second substrate 210, and a plurality of open spaces 330'' defined by a plurality of barrier portions 320'' protruding from the bottom portion 310'' may have a circular pattern on the plane. Each of the plurality of open spaces 330'' may be defined by one barrier 320'' to have a circular pattern on the plane, and may spatially have a space of a circular prism.

Figure 8:
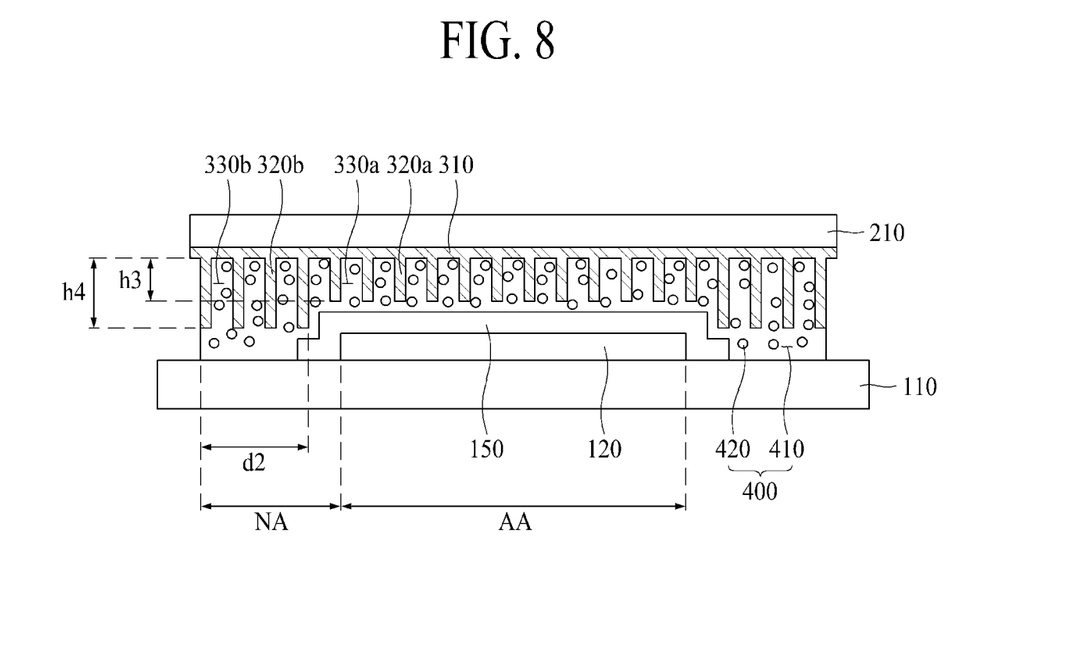
FIG. 8 is a brief cross-sectional view illustrating a display panel according to various embodiments of the present disclosure.

FIG. 8 is a brief cross-sectional view illustrating a display panel according to various embodiments of the present disclosure, and briefly illustrates the display area AA and the non-display area NA of the display panel. For convenience of description, FIG. 8 only shows the light emitting diode 120 and the encapsulation layer 150 of various elements on the first substrate 110 but is not limited thereto. The elements shown in FIG. 2 may be included in FIG. 8 and their detailed description will be omitted.

Referring to FIG. 8, the display panel according to various embodiments of the present disclosure may include a first substrate 110 and a second substrate 210 bonded to the first substrate 110. The first substrate 110 and the second substrate 210 may be bonded to each other by an adhesive layer 400. The adhesive layer 400 is disposed on the entire surface of the display area AA and the non-display area NA of the first substrate 110 to adhere the first substrate 110 and the second substrate 210 to each other.

The light emitting diode 120 and the encapsulation layer 150 for covering the light emitting diode 120 may be disposed on the first substrate 110.

A bottom portion 310 may be disposed on one surface (surface headed for the first substrate 110) of the second substrate 210, which adjoins the adhesive layer 400, and the second substrate 210 may include a plurality of first barrier portions 320a and a plurality of second barrier portions 320b protruded from the bottom portion 310, and a plurality of first open spaces 330a and a plurality of second open spaces 330b defined by the first and second barrier portions 320a and 320b.

The plurality of first barrier portions 320a may be disposed to correspond to the display area AA on the first substrate 110. The plurality of first barrier portions 320a may be disposed to correspond to the light emitting diode 120 disposed in the display area AA on the first substrate 110.

The plurality of second barrier portions 320b may be disposed to correspond to the non-display area NA on the first substrate 110.

In the first substrate 110, the display area AA on which the light emitting diode 120 is disposed may be higher than the non-display area AA, and the plurality of first and second barrier portions 320a and 320b may be different from each other in their heights to correspond to a step difference of the first substrate 110.

A height h4 of the plurality of second barrier portions 320b may be higher than a height h3 of the plurality of first barrier portions 320a. For example, the plurality of second barrier portions 320b may be formed with a height that may directly contact an upper surface of the first substrate 110.

According to various embodiments of the present disclosure, the height h4 of the plurality of second barrier portions 320b corresponding to the non-display area NA may be formed to be higher than the height h3 of the plurality of first barrier portions 320a corresponding to the display area AA, whereby moisture and oxygen may effectively be prevented from being permeated through the side between the first substrate 110 and the second substrate 210. Also, if the plurality of second barrier portions 320b are formed with the height that may directly contact the upper surface of the first substrate 110, the side between the first substrate 110 and the second substrate 210 may completely be sealed, whereby permeation of moisture and oxygen through the side between the first substrate 110 and the second substrate 210 may effectively be avoided.

The plurality of second barrier portions 320b may be disposed over a distance d2 from an end of the encapsulation layer 150 covering the light emitting diode 120 to a pad area. That is, the plurality of second barrier portions 320b may be disposed on the first substrate 110 to correspond to a portion having a relatively low height, and may be formed to be higher than the plurality of first barrier portions 320a, whereby the interval between the first substrate 110 and the second substrate 210 may be narrowed. As a result, permeation of external moisture and oxygen may effectively be avoided to improve moisture permeation resistance.

The distance between the respective second barrier portions 320b that define the plurality of second open spaces 330b may be disposed to be narrower than that between the respective first barrier portions 320a that define the plurality of first open spaces 330a. That is, the interval between the respective second barrier portions 320b disposed on an outer edge of the display panel may be more compact, whereby permeation of external moisture and oxygen may be more effectively avoided to more improve moisture permeation resistance.

Figure 9:
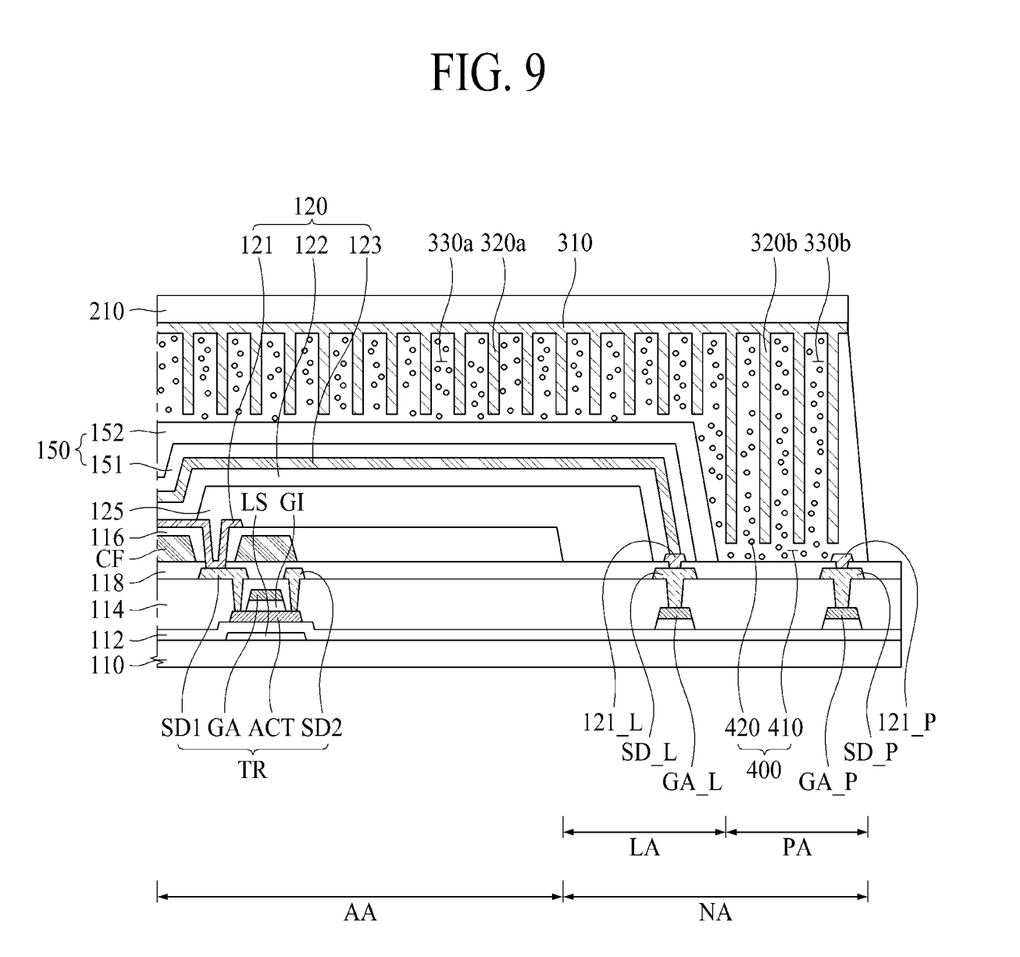
FIG. 9 is a cross-sectional view illustrating a display panel according to various embodiments of the present disclosure.

FIG. 9 is a cross-sectional view illustrating a display panel according to various embodiments of the present disclosure. FIG. 9 illustrates a portion of a boundary portion between the display area AA and the non-display area NA of the display panel.

Referring to FIG. 9, the display panel according to various embodiments of the present disclosure may include a first substrate 110 and a second substrate 210 bonded to the first substrate 110.

The first substrate 110 may include a thin film transistor TR, a light emitting diode 120 and an encapsulation layer 150 on the display area AA of the first substrate 110, and may include a link area LA and a pad area PA on the non-display area NA of the first substrate 110.

An array of pixels may be disposed on the display area AA of the first substrate 110, and therefore the display area AA may be an area on which an image is displayed. One pixel may include a plurality of subpixels. Each subpixel may include a red subpixel, a green subpixel, a blue subpixel and a white subpixel to constitute a unit pixel. The red, green, blue and white subpixels may be arranged in various orders within each unit pixel, and the order of their arrangement may be varied depending on color or structure. Each of the red, green, blue and white subpixels may include a light emitting diode disposed in a light emission area, and a pixel circuit for independently driving each light emitting diode.

The pixel circuit may include a switching thin film transistor, a driving thin film transistor, and a storage capacitor. The switching thin film transistor and the driving thin film transistor may be disposed in a non-light emission area except the light emission area of each subpixel, and the storage capacitor may be disposed in the light emission area of each subpixel. FIG. 9 shows only the driving thin film transistor TR for convenience of description but is not limited thereto.

The thin film transistor TR may include an active layer ACT, a gate insulating film GI, a gate electrode GA, a first source/drain electrode SD1, and a second source/drain electrode SD2.

The gate electrode GA may be formed on the gate insulating film GI to cover the active layer ACT. The gate electrode GA may be overlapped with a channel region of the active layer ACT by interposing the gate insulating film GI therebetween. The gate electrode GA may be made of a single layer or a multi-layered layer of Cu, Al, Mo, Cr, Au, Ti, Ni and Nd, or their alloy.

The first and second source/drain electrodes SD1 and SD2 may be connected with a source and/or drain region of the active layer ACT through a contact hole passing through the inter-layer dielectric film 114. Also, the first source/drain electrode SD1 may be exposed through a contact hole formed to pass through a planarization layer 116 and a passivation layer 118 and then connected with a first electrode 121 of the light emitting diode 120.

The first and second source/drain electrodes SD1 and SD2 may be made of, but not limited to, a single layer or a multi-layered layer of Cu, Al, Mo, Cr, Au, Ti, Ni and Nd, or their alloy.

The active layer ACT may form a channel region between the first and second source/drain electrodes SD1 and SD2. The active layer ACT may be formed above the first substrate 110, so as to be disposed below the gate electrode GA. The active layer ACT may be made of, but not limited to, amorphous silicon or polycrystalline silicon.

A buffer layer 112 and a light shielding layer LS may be disposed between the active layer ACT and the first substrate 110. The light shielding layer LS may be formed on the first substrate 110 to overlap the active layer ACT. Since the light shielding layer LS absorbs or reflects externally incident light, the light shielding layer LS may shield the external light from entering the active layer ACT. The buffer layer 112 may be made of SiOx, SiNx or a multi-layer of SiOx and SiNx. The buffer layer 112 may protect the thin film transistors TR from moisture permeated through the first substrate 110.

The light emitting diode 120 may include a first electrode 121 connected with the first source/drain electrode SD1 of the thin film transistor TR (e.g., driving thin film transistor), a light emitting portion 122 formed on the first electrode 121, and a second electrode 123 formed on the light emitting portion 122, so as to be connected with a low voltage supply line. In this case, the low voltage supply line supplies a low voltage lower than a high voltage supplied through a high voltage supply line.

The first electrode 121 is an anode electrode, and may be connected with the first source/drain electrode SD1 exposed through a contact hole passing through the planarization layer 116 and the passivation layer 118. The first electrode 121 may be disposed on the planarization layer 116, so as to be exposed from a light emission area defined by a bank 125. If the first electrode 121 is applied to a bottom emission type display panel, the first electrode 121 may be made of, but not limited to, indium tin oxide (ITO), indium zinc oxide (IZO), etc., which are transparent conductive materials.

The second electrode 123 is a cathode electrode, and may be disposed on upper surfaces and sides of the bank 125 and the light emitting portion 122 to face the first electrode 121 by interposing the light emitting portion 122. If the second electrode 123 is applied to a bottom emission type display panel, the second electrode 123 may be made of, but not limited to, a metal material such as Mg and Ag:Mg. Alternatively, the second electrode 123 may be made of a multi-layered structure that includes a transparent conductive film and an opaque conductive film of high reflective efficiency. In this case, the transparent conductive film may be made of a material having a low work function, such as ITO and IZO, and the opaque conductive film may be made of a single layer or a multi-layered layer of Al, Ag, Cu, Mo, Ti or their alloy. For example, the second electrode 123 may be formed in a stacked structure in which the transparent conductive film, the opaque conductive film and the transparent conductive film are sequentially stacked.

The light emitting portion 122 may be disposed on the first electrode 121 of the light emission area defined by the bank 125. A hole related layer that includes a hole injection layer and a hole transport layer may be disposed between the light emitting portion and the first electrode 121, and an electron related layer that includes an electron injection layer and an electron transport layer may be disposed between the light emitting portion 122 and the second electrode 123.

The bank 125 may be disposed on the first electrode 121 and the planarization layer 116. The bank 125 may be formed to cover an edge of the first electrode 121, thereby defining the light emission area. The bank 125 may be formed of, but not limited to, an organic film such as acryl resin, epoxy resin, phenolic resin, polyamide resin, and polyimide resin.

The second electrode 123 may be extended onto the bank 125. For example, the second electrode 123 may be extended onto a side of the bank 125, which is headed for the non-display area NA of the first substrate 110. The side of the bank 125, which is headed for the non-display area NA of the first substrate 110, may fully be covered by the second electrode 123. Therefore, the second electrode 123 may prevent the bank 125 from serving as a permeation path of external moisture.

The non-display area NA of the first substrate 110 may include a link area LA and a pad area PA. The encapsulation layer 150 may be disposed on the link area LA, and may not be disposed on the pad area PA. That is, the link area LA may be formed in an area that overlaps the encapsulation layer 150, and the pad area PA may be formed in an area that does not overlap the encapsulation layer 150.

A link line may be disposed on the link area LA. The link line may be a power line, that is, a line for supplying a base power source VSS. The link line may include a first link electrode SD_L and a second link electrode GA_L, wherein the first link electrode SD_L may be formed of the same material as that of the first and second source/drain electrodes SD1 and SD2 on the same layer as the first and second source/drain electrodes SD1 and SD2, and the second link electrode GA_L may be formed of the same material as that of the gate electrode GA. For example, the link line may be connected with a connection electrode 121_L and the second electrode 123 of the light emitting diode 120 may be connected with the link line through the connection electrode 121_L to allow a power source to be supplied thereto. The connection electrode 121_L may be formed of the same material as that of the first electrode 121.

The pad area PA may be provided with a plurality of pads for supplying a driving signal to each of signal lines that include at least any one of a scan line, a data line, a high potential voltage (VDD) supply line and a low potential voltage (VSS) supply line, which are disposed on the display area AA.

The pad area PA may include a connection electrode 121_P, a first pad electrode SD_P, and a second pad electrode GA_P. The connection electrode 121_P may be formed of the same material as that of the first electrode 121, the first pad electrode SD_P may be formed of the same material as that of the first and second source/drain electrodes SD1 and SD2 on the same layer as the first and second source/drain electrodes SD1 and SD2, and the second pad electrode GA_P may be formed of the same material as that of the gate electrode GA.

A color filter CF may be disposed between the first substrate 110 and the light emitting diode 120. For example, the color filter CF may be arranged between the passivation layer 118 and the planarization layer 116. A step difference caused by the color filter CF may be removed by the planarization layer 116. The color filter CF may change a color indicated by light generated by the light emitting portion 122. For example, the light emitting portion 122 may generate light indicating a white color, and the color filter CF may embody a blue, red or green color by using the light generated by the light emitting portion 122.

The encapsulation layer 150 for preventing the light emitting diode 120 from being oxidized or damaged by external moisture, oxygen or impurities may be disposed on the light emitting diode 120. The encapsulation layer 150 may be formed to surround the light emitting diode 120. The encapsulation layer 150 may be formed in a double layered structure in which an organic material layer 151 and an inorganic material layer 152 are stacked alternately. The organic material layer 151 may be a capping layer disposed on the second electrode 123 to protect the first electrode 121, the light emitting portion 122 and the second electrode 123. The organic material layer 151 may be formed to be relatively thicker than the inorganic material layer 152 so as to sufficiently cover particles that may occur during a manufacturing process. The inorganic material layer 152 may serve to shield moisture or oxygen from being permeated into the light emitting diode 120. For example, the organic material layer 151 may include any one material of acryl resin, epoxy resin, phenolic resin, polyamide resin, polyimide resin, benzocyclobutene resin, and fluoride resin. The inorganic material layer 152 may include a material such as SiNx, SiOx, SiON or AlxOy.

An adhesive layer 400 may be disposed on the encapsulation layer 150. The adhesive layer 400 is formed to cover the display area AA and the non-display area NA of the first substrate 110 and serves to shield moisture or oxygen from being permeated into the light emitting diode 120. Also, the adhesive layer 400 serves to adhere the first substrate 110 provided with the light emitting diode 120 and the second substrate 210 to each other.

The adhesive layer 400 may seal the light emitting diode 120 and adhere the first substrate 110 and the second substrate 210 to each other. The adhesive layer 400 may include a hardening resin 410 and hygroscopic particles 420 dispersed in the hardening resin 410.

According to various embodiments of the present disclosure, the second substrate 210 may include a barrier structure portion 300 on one surface (surface headed toward the first substrate 110) that adjoins the adhesive layer 400. The barrier structure portion 300 may include a bottom portion 310, a plurality of first and second barrier portions 320a and 320b protruding from the bottom portion 310, and a plurality of first and second open spaces 330a and 330b defined by the plurality of first and second barrier portions 320a and 320b.

The plurality of first barrier portions 320a may be disposed to correspond to the display area AA on the first substrate 110. The plurality of first barrier portions 320a may be disposed to correspond to the light emitting diode 120 disposed in the display area AA on the first substrate 110. The plurality of first barrier portions 320a are areas where a step difference is high on the first substrate 110, and may be disposed to correspond to the area where the light emitting diode 120 and the encapsulation layer 150 are disposed.

The plurality of second barrier portions 320b may be disposed to correspond to the non-display area NA on the first substrate 110. The plurality of second barrier portions 320b are areas where a step difference is low on the first substrate 110, and may be disposed to correspond to the area where the light emitting diode 120 and the encapsulation layer 150 are not disposed from the outer edge of the first substrate 110.

According to various embodiments of the present disclosure, the plurality of second barrier portions 320b corresponding to the non-display area NA may be formed to be higher than the plurality of first barrier portions 320a corresponding to the display area AA, whereby moisture and oxygen permeation through the side between the first substrate 110 and the second substrate 210 may effectively be avoided. Also, if the plurality of second barrier portions 320b are formed with the height that may directly contact the upper surface of the first substrate 110, the side between the first substrate 110 and the second substrate 210 may be sealed completely, whereby permeation of moisture and oxygen through the side between the first substrate 110 and the second substrate 210 may effectively be avoided.

Also, the distance between the respective second barrier portions 320b that define the plurality of second open spaces 330b may be disposed to be narrower than that between the respective first barrier portions 320a that define the plurality of first open spaces 330a. That is, the interval between the respective second barrier portions 320b disposed on an outer edge of the display panel may be more compact, whereby permeation of external moisture and oxygen may be more effectively avoided to more improve moisture permeation resistance.

Figure 10:
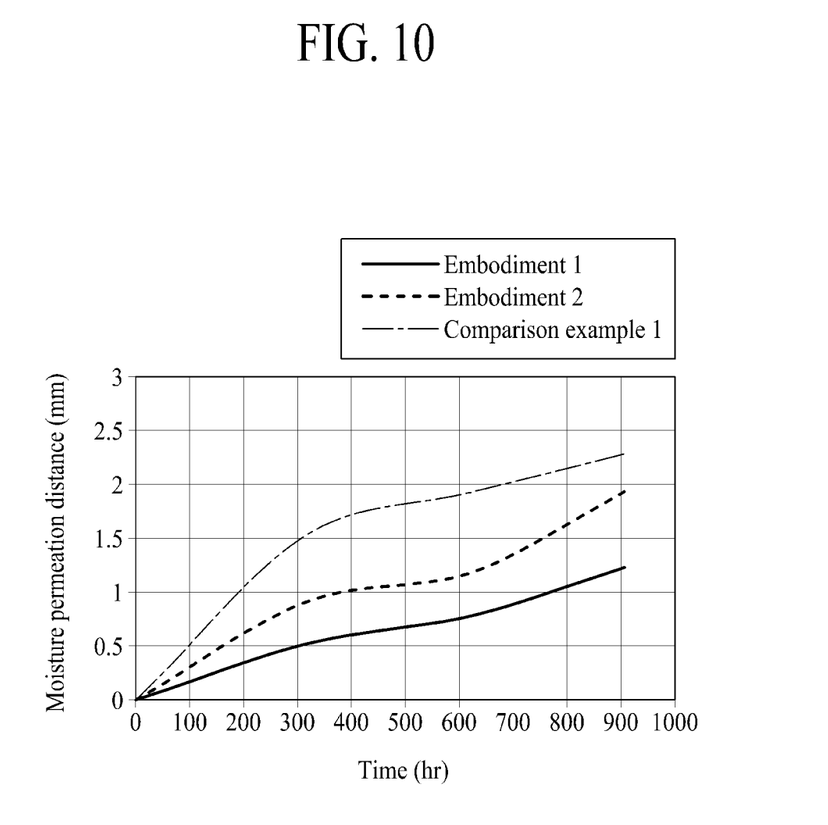
FIG. 10 is a graph illustrating an improvement effect of moisture permeation resistance of a display panel according to various embodiments of the present disclosure.

FIG. 10 is a graph illustrating an improvement effect of moisture permeation resistance of a display panel according to various embodiments of the present disclosure.

The graph of FIG. 10 illustrates a result measured for a distance of moisture permeated from the edge of the substrate in accordance with the passage of time after reliability evaluation in 85° C./85% RH is performed for bonding between the first substrate 110 and the second substrate 210 having no barrier structure portion 300 according to a comparison example, bonding between the first substrate 110 and the second substrate 210 provided with the first barrier portion 320a disposed to correspond to the display area AA of the first substrate 110 and the second barrier portion 320b disposed to correspond to the non-display area NA of the first substrate 110, the second barrier portion 320b being higher than the first barrier portion 320a according to the embodiment 1, that is, as shown in FIG. 9, and bonding between the first substrate 110 and the second substrate 210 provided with the barrier portions 320 disposed at the same height on the second substrate 210 according to the embodiment 2, that is, as shown in FIG. 2.

As will be aware of it from FIG. 10, it is noted that moisture permeability is more improved in the embodiments 1 and 2, in which the barrier structure portion according to various embodiments of the present disclosure is provided, than in the comparison example in which the barrier structure portion is not provided. It is also noted that moisture permeability is more relatively improved in the embodiment 1 in which the barrier structure portion is provided to be higher in the non-display area, than in the embodiment 2 in which the barrier structure portion is provided with a uniform height.

The display panel according to various embodiments of the present disclosure may be described as follows.

The display panel according to various embodiments of the present disclosure may comprise a first substrate including a display area and a non-display area surrounding the display area, a light emitting diode disposed in the display area on the first substrate, an adhesive layer covering the display area and the non-display area on the first substrate, and a second substrate bonded to the first substrate by the adhesive layer, wherein the second substrate may include a barrier structure portion for defining a plurality of open spaces on one surface of the second substrate that adjoins the adhesive layer.

In the display panel according to various embodiments of the present disclosure, the barrier structure portion may further include a coating film surrounding a surface.

In the display panel according to various embodiments of the present disclosure, the barrier structure portion may include a bottom portion disposed on the second substrate, and a plurality of barrier portions protruded from the bottom portion to define a plurality of open spaces.

In the display panel according to various embodiments of the present disclosure, the bottom portion and the plurality of barrier portions may be made of the same material.

In the display panel according to various embodiments of the present disclosure, the coating film may be made of a material different from that of the bottom portion and the plurality of barrier portions.

In the display panel according to various embodiments of the present disclosure, the bottom portion and the plurality of barrier portions may be made of polymer, and the coating film may be made of metal or inorganic oxide.

In the display panel according to various embodiments of the present disclosure, each of the plurality of open spaces may be defined in a polygonal shape or a circular shape on the plane by the plurality of barrier portions.

In the display panel according to various embodiments of the present disclosure, each of the plurality of open spaces may have a minimum diameter of 10 μm to 500 μm on the bottom portion.

In the display panel according to various embodiments of the present disclosure, the adhesive layer may fill the plurality of open spaces defined by the barrier structure portion.

In the display panel according to various embodiments of the present disclosure, the adhesive layer may further include a plurality of hygroscopic particles.

In the display panel according to various embodiments of the present disclosure, the plurality of hygroscopic particles may be disposed in the plurality of open spaces.

In the display panel according to various embodiments of the present disclosure, the adhesive layer may have a height higher than that of the barrier structure portion.

In the display panel according to various embodiments of the present disclosure, the height of the adhesive layer may be higher than the barrier structure portion as much as 5 μm to 10 μm.

The display panel according to various embodiments of the present disclosure may further comprise an encapsulation layer between the light emitting diode and the adhesive layer on the first substrate.

In the display panel according to various embodiments of the present disclosure, the encapsulation layer and the barrier structure portion on the second substrate may be spaced apart from each other as much as 5 μm to 10 μm by interposing the adhesive layer therebetween.

In the display panel according to various embodiments of the present disclosure, the barrier structure portion may include a bottom portion disposed on the second substrate, a plurality of first barrier portions disposed to correspond to the display area on the first substrate and protruded from the bottom portion to define a plurality of first open spaces, and a plurality of second barrier portions disposed to correspond to the non-display area on the first substrate and protruded from the bottom portion to define a plurality of second open spaces.

In the display panel according to various embodiments of the present disclosure, a height of the plurality of second barrier portions may be higher than that of the plurality of first barrier portions.

In the display panel according to various embodiments of the present disclosure, the plurality of second barrier portions may be directly contacted the first substrate.

In the display panel according to various embodiments of the present disclosure, a distance between the respective first barrier portions defining the first open spaces may be different from that between the respective second barrier portions defining the second open spaces.

In the display panel according to various embodiments of the present disclosure, a distance between the respective second barrier portions defining the second open spaces may be narrower than that between the respective first barrier portions defining the first open spaces.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel comprising:
a first substrate including a display area and a non-display area surrounding the display area;
a second substrate covering the display area and the non-display area of the first substrate;
a barrier structure portion disposed between the first substrate and the second substrate, and configured to have a plurality of open spaces on a surface of the second substrate; and
an adhesive layer configured to adhere the first substrate and the second substrate to each other,
wherein the adhesive layer further includes a plurality of hygroscopic particles.

2. The display panel of claim 1, wherein the barrier structure portion includes:
a bottom portion disposed on the surface of the second substrate; and
a plurality of barrier portions protruding from the bottom portion to define the plurality of open spaces.

3. The display panel of claim 2, wherein the bottom portion and the plurality of barrier portions are made of a same material.

4. The display panel of claim 2, wherein the barrier structure portion further includes a coating film surrounding the surface.

5. The display panel of claim 4, wherein the coating film is made of a material different from that of the bottom portion and the plurality of barrier portions.

6. The display panel of claim 4, wherein the bottom portion and the plurality of barrier portions are made of polymer, and the coating film is made of metal or inorganic oxide.

7. The display panel of claim 2, wherein each of the plurality of open spaces are defined in a polygonal shape or a circular shape on a plane by the plurality of barrier portions.

8. The display panel of claim 7, wherein each of the plurality of open spaces has a minimum diameter of 10 μm to 500 μm on the bottom portion.

9. The display panel of claim 1, wherein the second substrate is made of glass, plastic or metal.

10. The display panel of claim 1, wherein the adhesive layer fills the plurality of open spaces.

11. The display panel of claim 1, wherein the plurality of hygroscopic particles are disposed in the plurality of open spaces.

12. The display panel of claim 1, wherein the adhesive layer has a height higher than that of the barrier structure portion.

13. The display panel of claim 12, wherein the height of the adhesive layer is higher than the barrier structure portion by as much as 5 μm to 10 μm.

14. The display panel of claim 1, further comprising:
a light emitting diode disposed in the display area on the first substrate; and
an encapsulation layer disposed on the light emitting diode.

15. The display panel of claim 14, wherein the encapsulation layer and the barrier structure portion on the second substrate are spaced apart from each other by as much as 5 μm to 10 μm.

16. The display panel of claim 1, wherein the barrier structure portion includes:
a bottom portion disposed on the surface of the second substrate;
a plurality of first barrier portions disposed to correspond to the display area on the first substrate and protruding from the bottom portion to define a plurality of first open spaces; and
a plurality of second barrier portions disposed to correspond to the non-display area on the first substrate and protruding from the bottom portion to define a plurality of second open spaces.

17. The display panel of claim 16, wherein a height of the plurality of second barrier portions is higher than that of the plurality of first barrier portions.

18. The display panel of claim 16, wherein a distance between the respective second barrier portions defining the second open spaces is different from a distance between the respective first barrier portions defining the first open spaces, or narrower than the distance between the respective first barrier portions defining the first open spaces.

* * * * *